United States Patent
Shen et al.

(10) Patent No.: US 7,670,760 B2
(45) Date of Patent: Mar. 2, 2010

(54) TREATMENT FOR REDUCTION OF LINE EDGE ROUGHNESS

(75) Inventors: Jinmiao James Shen, Austin, TX (US); Jonathan L. Cobb, Austin, TX (US); William D. Darlington, Austin, TX (US); Brian J. Fisher, Austin, TX (US); Mark D. Hall, Austin, TX (US); Vikas R. Sheth, Austin, TX (US); Mehul D. Shroff, Austin, TX (US); James E. Vasek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 519 days.

(21) Appl. No.: 11/369,513

(22) Filed: Mar. 6, 2006

(65) Prior Publication Data

US 2007/0207404 A1   Sep. 6, 2007

(51) Int. Cl.
  *G03F 1/00*  (2006.01)
(52) U.S. Cl. ..................................... 430/330
(58) Field of Classification Search ................ 430/330, 430/327, 270.1
See application file for complete search history.

(56) References Cited

U.S. PATENT DOCUMENTS

| 4,840,874 | A | * | 6/1989 | Shigemitsu et al. | ......... 430/296 |
| 5,120,634 | A | * | 6/1992 | Kobayashi | .................. 430/330 |
| 6,582,891 | B1 | * | 6/2003 | Hallock et al. | .............. 430/330 |
| 6,764,946 | B1 | | 7/2004 | Amblard | |
| 2004/0126705 | A1 | | 7/2004 | Lu et al. | |
| 2004/0166447 | A1 | | 8/2004 | Chang et al. | |
| 2004/0166448 | A1 | | 8/2004 | Chang et al. | |
| 2004/0185349 | A1 | * | 9/2004 | Yang | .............................. 430/5 |

* cited by examiner

*Primary Examiner*—Thorl Chea
(74) *Attorney, Agent, or Firm*—John A. Fortkort; Fortkort & Houston P.C.

(57) ABSTRACT

A method for reducing line edge roughness (LER) in a layer of photoresist is provided. In accordance with the method, a layer of photoresist is applied to a substrate. The layer of photoresist is then patterned and annealed in an atmosphere comprising at least one gas selected from the group consisting of hydrogen, nitrogen and fluorine-containing materials. Preferably, the anneal is performed after patterning the photoresist, but either immediately after, or subsequent to, the trim.

19 Claims, 4 Drawing Sheets

TREATMENT FOR REDUCTION OF LINE EDGE ROUGHNESS

FIELD OF THE DISCLOSURE

The present disclosure relates generally to photolithography, and more particularly to methods for reducing line edge roughness (LER) in photoresist.

BACKGROUND OF THE DISCLOSURE

In semiconductor processing, structures are commonly formed on a substrate through lithographic processes. In such processes, a layer of photoresist is deposited on a substrate and is patterned by exposing it to a source of radiation through a mask or reticle. Solubility differences between the exposed and unexposed portion of the photoresist may then be exploited to selectively remove the undesired portion of the photoresist, thus leaving a desired pattern of photoresist on the substrate. The pattern formed in the photoresist layer may then be transferred to the underlying layer through etching. Alternatively, the photoresist layer can be used to block dopant implantation into portions of the underlying layer or to retard reaction of the protected portions of the underlying layer. Thereafter, the remaining portions of the photoresist layer can be stripped.

The ongoing trend in the semiconductor arts toward smaller feature sizes and higher structure densities has created a corresponding need to increase the resolution capability of lithography processes. To that end, the use of actinic radiation having shorter wavelengths has become more common.

As the critical dimensions of features that are formed using ultra thin resists become smaller, the line edge roughness (LER) of the photoresist tends to increase. Since this roughness is passed on to the features defined by the photomask, when LER becomes sufficiently high, device performance is adversely affected. Hence, the need for further reduction in critical dimensions in semiconductor devices has created a need for further reductions in LER.

Accordingly, there exists a need in the art for improved lithography processes that provide for greater control of LER. There is also a need in the art for lithography processes that can produce semiconductor devices with smaller critical dimensions. These and other needs may be met by the devices and methodologies described herein.

DETAILED DESCRIPTION

As used herein, the term "line edge roughness" (LER) refers to the 3 sigma standard deviation of the actual line edge relative to the mean line edge.

As used herein, the term "line width roughness" (LWR) refers to the 3 sigma standard deviation of the actual line width relative to the mean line width.

In one aspect, a method is provided herein for reducing line edge roughness (LER) in a layer of photoresist. In accordance with the method, a layer of photoresist is applied to a substrate. The layer of photoresist is then annealed in an atmosphere comprising at least one gas selected from the group consisting of hydrogen, nitrogen and fluorine.

In another aspect, a method is provided herein for reducing line edge roughness (LER) in a layer of photoresist. In accordance with the method, a layer of photoresist is applied to a substrate. The layer of photoresist is then annealed at a temperature within the range of about 90° C. to about 150° C. in an atmosphere comprising about 1% to about 10% hydrogen, about 90 to about 99% nitrogen, and about 0% to about 6% of a fluorine-containing material.

These and other aspects of the present disclosure are described in greater detail below.

It has now been found that the aforementioned need for reduced LER may be met by annealing the photoresist (preferably after development and photoresist trimming) in an atmosphere comprising one or more gases selected from the group consisting of nitrogen and forming gases (i.e., mixtures of up to 10% hydrogen in nitrogen). In some embodiments, fluorine may also be included in the anneal gas chemistry, preferably in the form of a fluorine-containing material such as $NF_3$. The anneal process is preferably performed ex situ.

Without wishing to be bound by theory, it is believed that annealing the photoresist (either after lithography or after photoresist trim) at a higher temperature and in the aforementioned atmospheres reduces LER by inducing more extensive cross-linking in the resist, thus increasing the hardness of the photoresist. This, in turn, renders the photoresist more resistant to deformation and exfoliation during subsequent semiconductor processing, such as gate etch processing. It is further believed that, at higher temperatures, the upper corners of the resist become partially rounded/smoothed, which helps to further reduce LER by smoothing edge features (especially gates). In some embodiments, the addition of fluorine to the forming gas may help to improve the etch resistance of the photoresist to commonly used semiconductor processing plasmas based on F, Cl and/or Br, which further favors CD/etch-profile control. Test results have demonstrated a greater than 10% reduction in LER through the anneal process described herein, with further improvements possible through treatment process optimization.

Figure 1:
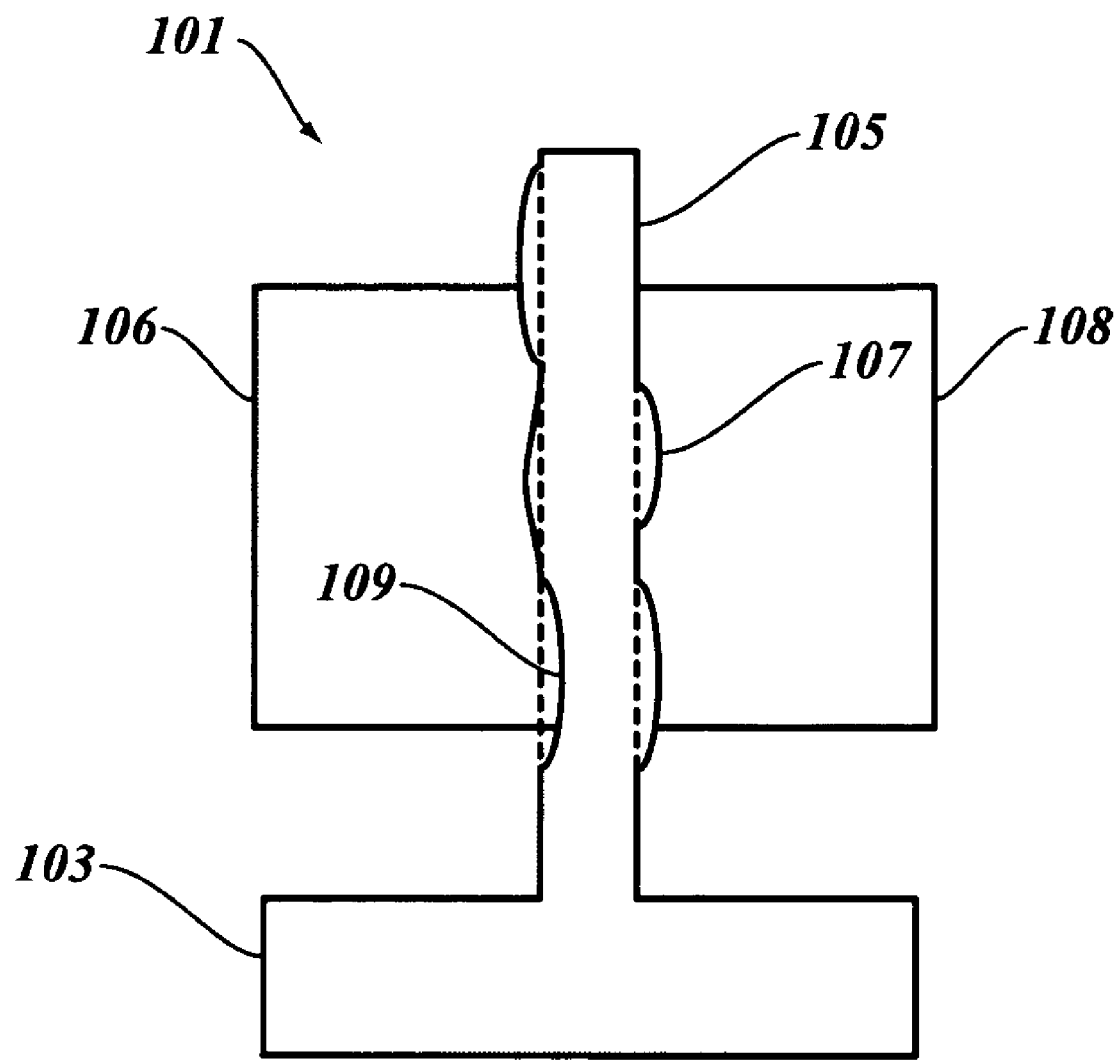
FIG. 1 is an illustration of line edge roughness (LER) in a semiconductor gate structure.

The effect of LER on device performance may be appreciated with respect to FIG. 1, which is a top view of a gate structure. The particular embodiment of the gate structure 101 depicted therein comprises a connection region 103 and a gate region 105. Source 106 and drain 108 regions are present on opposing sides of the gate region 105. The LER in the structure is manifested as protrusions 107 and indentations 109 that represent variations from the true linear structure denoted by the dashed lines. Such protrusions 107 and indentations 109 are imparted to the gate structure 101 in part from the photoresist that is used to define it. Hence, LER in the photoresist contributes to LER in the gate structure (the etch process also contributes to LER in the gate structure).

During the formation of implant regions adjacent to the edge of the gate (these implant regions include the source 106 and drain 108 regions, as well as any halos or extensions present in the device), some of the implant material is formed adjacent to these protrusions 107 and indentations 109. This, in turn, modifies the channel length of the device. In the case of indentations, the channel length is shortened, thus resulting in a leakier device with a lower threshold voltage. As a result, performance variations of similar devices increase and result in increased variability of circuit performance and functionality. Since this problem is exacerbated at smaller dimensions, LER has become an increasingly significant problem as the industry has moved to ever smaller technology nodes. This problem is addressed by the methodologies described herein.

The improvements in LER attainable with the methodologies disclosed herein may be further understood with respect to the following non-limiting examples. In these examples, the following terms and annotations have the following meanings:

The term "BL" means "baseline".

PAR 707 is a 193 nm resist which is commercially available from Sumitomo Chemicals, Tokyo, Japan. While PAR 707 is the resist that was used to generate the data described herein, one skilled in the art will appreciate that similar results could be obtained with other photoresists. Thus, the methodologies described herein are not limited to this particular resist.

The data set forth in the following examples was obtained with the help of a software package available commercially from EUV Technologies (Martinez, Calif.), which is capable of capturing SEM images and performing LER and LWR measurements on the captured images.

The wafers were imaged in a wafer stepper. The maximum field size that can be exposed on the stepper was such that, for 8 inch wafer, about 30 exposures or images were obtained per wafer (each image is referred to as a field). Within the field, 6 sites were measured. Across the wafer, 10 fields are measured. Therefore, a total of 60 measurements (including 60 critical dimension (CD) measurements and 60 LWR measurements) were made. Since each gate examined has two edges, a total of 120 LER measurements were made on each sample wafer.

Examples 1-2

These examples illustrate the improvement in line width roughness (LWR) achievable using the methodologies described herein.

A series of line width roughness (LWR) measurements were made on a semiconductor wafer patterned with PAR™ 707 photoresist. The measurements were made post-trim (that is, after the photoresist was subjected to a trim etch).

EXAMPLE 1 represents the baseline case, denoted herein as "BL". In this example, the photoresist was not subjected to an anneal. By contrast, in EXAMPLE 2, the photoresist was annealed (after trimming) with a forming gas (in this case, a mixture of 3% hydrogen in nitrogen) at a pressure of 1 Torr, an anneal temperature of 90° C. and an anneal duration of 60 seconds.

Figure 2:
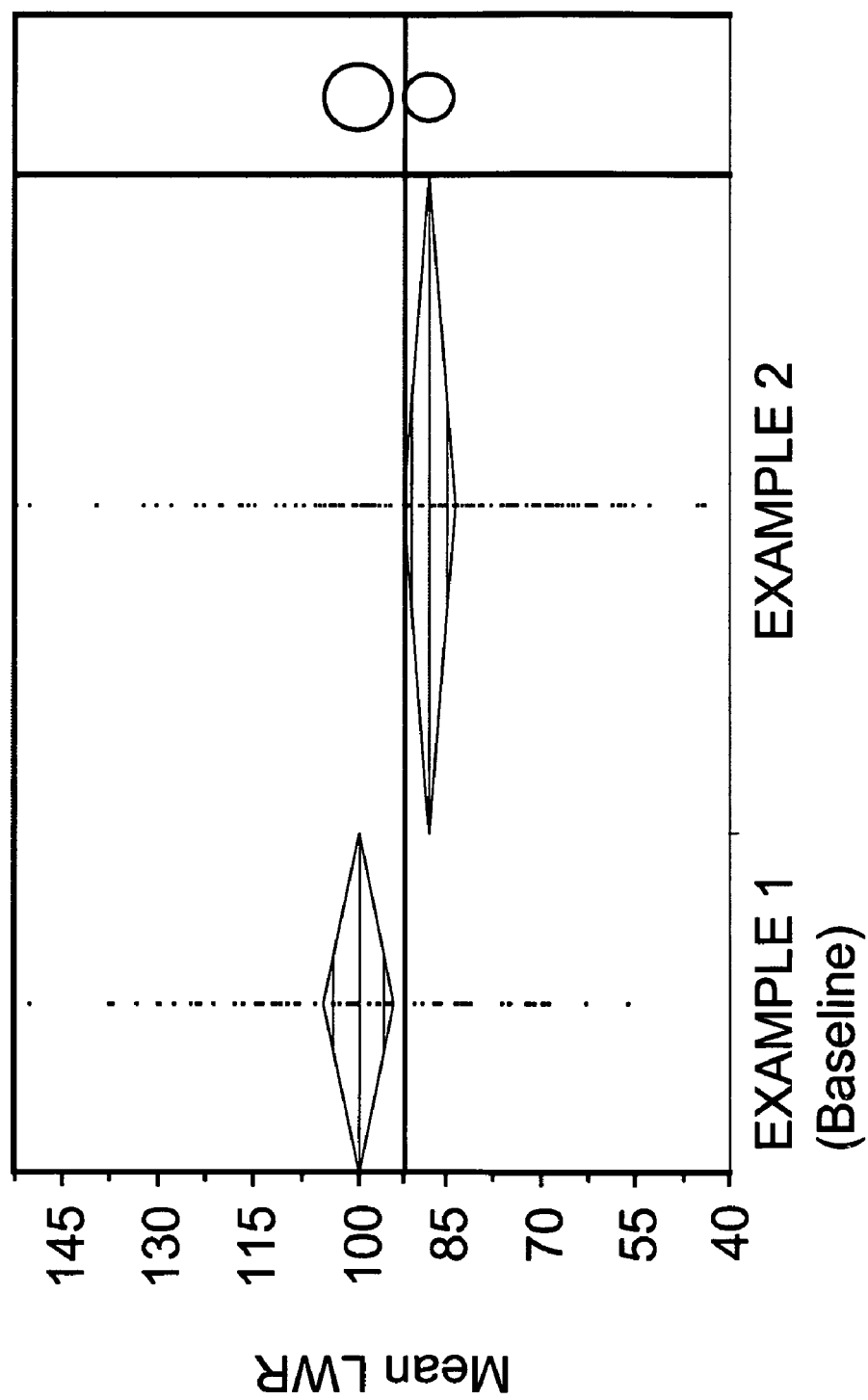
FIG. 2 is a graph of mean line width roughness (LWR) for a baseline structure and for a structure treated in accordance with the methodology disclosed herein.

The results of the LWR measurements are depicted in FIG. 2, which is a graph of line width roughness as a function of split. The left hand side of the graph depicts the baseline case of EXAMPLE 1. The middle of the graph depicts the best split results achieved with the data of EXAMPLE 2. The circles on the right of the graph are statistical significance circles (95% confidence) for EXAMPLE 1 (upper circle) and EXAMPLE 2 (lower circle). As seen therein, the two circles do not overlap, which thus suggests that the mean difference between the two data sets (i.e., a difference in line width roughness of about 10%) is statistically significant at a 95% confidence interval. It is thus seen that the anneal process performed on the photoresist had the effect of significantly improving LER.

Examples 3-5

These examples further illustrate the improvement in line width roughness (LWR) achievable using the methodology described herein. In these examples, EXAMPLE 2 was repeated, with certain variations made to the anneal gas chemistry and to the conditions of the anneal.

EXAMPLE 3 represents the baseline case, denoted herein as "BL", in which the photoresist was not subjected to an anneal.

In EXAMPLE 4, the photoresist was annealed (after trimming) for 60 seconds at a temperature of 120° C. and at a pressure of 1 Torr with a forming gas (a mixture of 3% hydrogen in nitrogen).

In EXAMPLE 5, the photoresist was annealed (after trimming) for 60 seconds at a temperature of 120° C. and at a pressure of 3 Torr with nitrogen ($N_2$).

Figure 3:
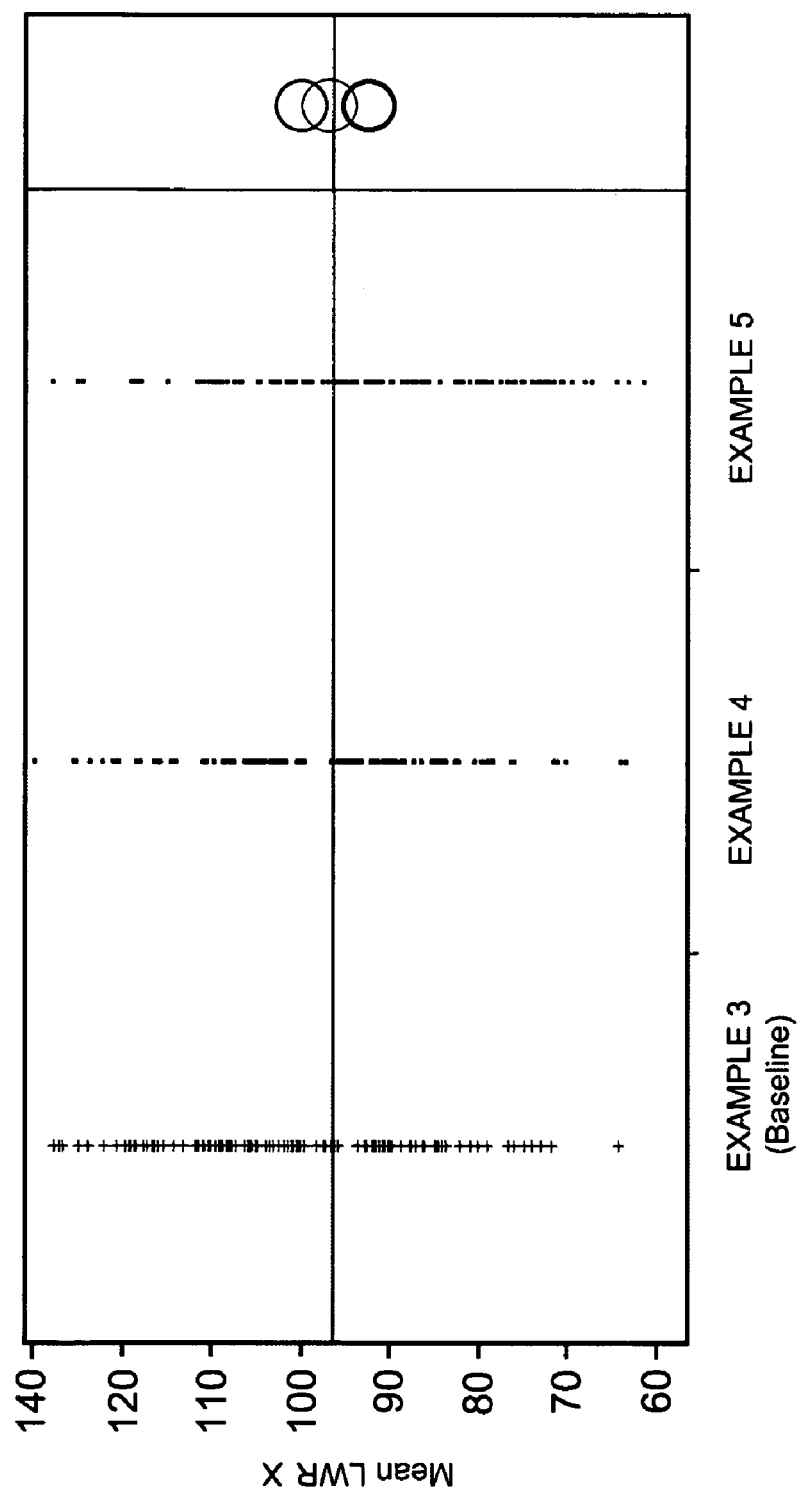
FIG. 3 is a graph of mean line width roughness (LWR) for a baseline structure and for a structure treated in accordance with the methodology disclosed herein.

The results of the LWR measurements are depicted in FIG. 3, which is a graph of LWR as a function of split. The circles on the right of the graph are statistical significance circles (95% confidence). The upper circle corresponds to EXAMPLE 3, the middle circle corresponds to EXAMPLE 4, and the lower circle corresponds to EXAMPLE 5. The mean difference in LWR between the data sets of Examples 3 and 5 is about 10%. Moreover, the upper and lower circles corresponding to these data sets do not overlap, which thus suggests that the mean difference is statistically significant at a 95% confidence interval. The data also show an improvement in EXAMPLE 4 as compared to EXAMPLE 3 (although the statistical significance of this difference has a greater degree of uncertainty at a 95% confidence interval). Hence, these examples again illustrate the improvements in LWR attainable through the methodologies disclosed herein.

Examples 6-10

These examples illustrate the effect of forming gas (with or without fluorine) on LER under various anneal conditions. In these examples, EXAMPLE 2 was repeated, with certain variations made to the anneal gas chemistry and to the conditions of the anneal.

EXAMPLE 6 represents the baseline case, denoted herein as "BL", in which the photoresist was not subjected to an anneal.

In EXAMPLES 7-10, the photoresist was annealed using the conditions set forth in TABLE 1.

TABLE 1

Relationship Between Resist Treatment, LER and Defectivity

| EXAMPLE | $N_2/H_2$ (SCCM) | $NF_3$ (SCCM) | Pressure (Torr) | Temp. (° C.) | Duration (Seconds) |
|---|---|---|---|---|---|
| 7 | 500 | 0 | 1 | 90 | 60 |
| 8 | 500 | 0 | 1 | 125 | 30 |
| 9 | 500 | 8 | 1 | 90 | 60 |
| 10 | 500 | 16 | 1 | 90 | 60 |

As seen in TABLE 2 below, all four of the anneal conditions investigated yielded reductions in both LWR and LER as compared to the baseline process. The conditions of EXAMPLE 8 yielded the best results. As noted above, the mean LER listed in TABLE 2 represents the deviation of the line edge from a perfect straight edge.

TABLE 2

Effect of Forming Gas on LER

| Split | CD[1] Mean | CD[1] Sigma | LWR[2] Mean | LWR[2] Sigma | LER[3] Mean | LER[3] Sigma |
|---|---|---|---|---|---|---|
| EXAMPLE 6 (BL) | 100 | 5.3 | 100 | 21.4 | 100 | 17.3 |
| EXAMPLE 7 | 104.2 | 5.9 | 88.6 | 21.4 | 92.3 | 19.2 |
| EXAMPLE 8 | 103.8 | 5.1 | 91.4 | 22.9 | 88.5 | 19.2 |
| EXAMPLE 9 | 100.6 | 5.9 | 95.7 | 24.3 | 94.2 | 17.3 |
| EXAMPLE 10 | 100.4 | 11.6 | 91.4 | 18.6 | 92.3 | 15.4 |

[1]Values normalized to baseline CD × 100
[2]Values normalized to baseline LWR × 100
[3]Values normalized to baseline LER × 100

Examples 11-23

A number of experiments were conducted to further investigate the improvements in LER attainable with various anneal conditions and chemistries. The results of these experiments are set forth in TABLE 3. In each example, a forming gas was utilized during the anneal that contained 3% hydrogen and 97% nitrogen at a flow rate of 500 sccm. In some of the embodiments, amounts of fluorine (in the form of $NF_3$) were supplied at the specified rates (in sccm). The data is arranged in ascending order by mean LER, and has been normalized to the worst case LER (EXAMPLE 23).

TABLE 3

LER Results

| EXAMPLE | Conditions | Mean LER | Standard Deviation | Standard Error Mean | Lower 95% | Upper 95% |
|---|---|---|---|---|---|---|
| 11 | Temp.: 130° C. Press.: 1 Torr Gas: 32 $NF_3$ Duration: 60 sec. | 90.5 | 13.0 | 1.2 | 88.2 | 92.9 |
| 12 | Temp.: 110° C. Press.: 1 Torr Gas: 0 $NF_3$ Duration: 30 sec. | 90.0 | 14.0 | 1.8 | 87.3 | 94.4 |
| 13 | Temp.: 130° C. Press.: 1 Torr Gas: 0 $NF_3$ Duration: 60 sec. | 91.5 | 12.7 | 1.2 | 89.2 | 93.8 |
| 14 | Temp.: 90° C. Press.: 1 Torr Gas: 0 $NF_3$ Duration: 60 sec. | 91.9 | 18.0 | 2.3 | 87.4 | 96.5 |
| 15 | Temp.: 130° C. Press.: 1 Torr Gas: 32 $NF_3$ Duration: 30 sec. | 95.0 | 13.2 | 1.2 | 92.7 | 97.4 |
| 16 | Temp.: 130° C. Press.: 1 Torr Gas: 0 $NF_3$ Duration: 30 sec. | 95.4 | 14.2 | 1.3 | 92.8 | 97.9 |
| 17 | Temp.: 90° C. Press.: 1 Torr Gas: 0 $NF_3$ Duration: 90 sec. | 95.5 | 16.8 | 1.5 | 92.5 | 98.5 |
| 18 | Temp.: 90° C. Press.: 1.5 Torr Gas: 16 $NF_3$ Duration: 30 sec. | 96.0 | 14.7 | 1.3 | 93.4 | 98.6 |
| 19 | Temp.: 90° C. Press.: 1 Torr Gas: 32 $NF_3$ Duration: 60 sec. | 96.2 | 14.9 | 1.4 | 93.5 | 98.8 |
| 20 | Temp.: 90° C. Press.: 1 Torr Gas: 16 $NF_3$ Duration: 30 sec. | 96.3 | 16.3 | 1.5 | 93.4 | 99.3 |
| 21 | Temp.: 90° C. Press.: 1 Torr Gas: 32 $NF_3$ Duration: 30 sec. | 98.9 | 16.3 | 1.5 | 96.1 | 101.9 |
| 22 | Temp.: 90° C. Press.: 1 Torr Gas: 0 $NF_3$ Duration: 30 sec. | 99.1 | 16.5 | 1.2 | 96.8 | 101.5 |
| 23 | Temp.: 90° C. Press.: 0.5 Torr Gas: 16 $NF_3$ Duration: 30 sec. | 100 | 16.5 | 1.5 | 97.1 | 102.3 |

Significantly, each of the examples set forth in TABLE 3 gave rise to LER values that were significantly less than the baseline LER of TABLE 2. EXAMPLE 11 (referred to below) gave the best results from an average LER perspective, exhibiting a normalized mean LER of 90.5, while EXAMPLE 13 (also referred to below) exhibited a normalized mean LER of 91.5.

Figure 4:
FIG. 4 is a series of micrographs which illustrate the improvement in LER achievable with the methodology described herein.
Figure 4:
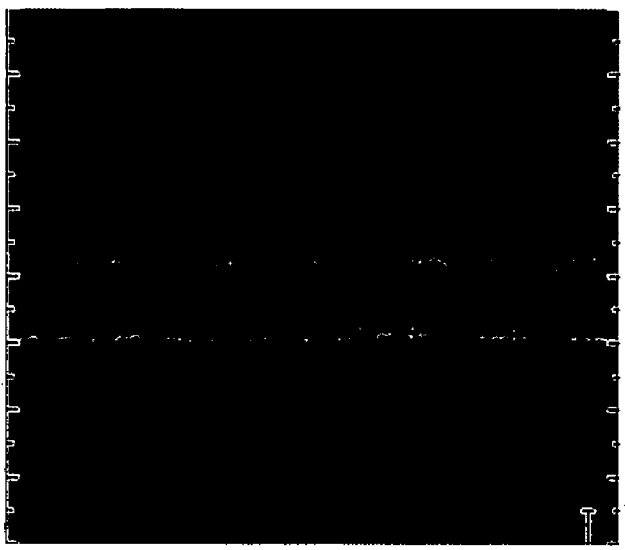
Figure 4:

FIG. 4 shows three SEMs of three different photoresist lines of the type used to define gate structures. The first micrograph is a baseline structure in which the photoresist was not subjected to an anneal. The second and third micrographs correspond to the embodiments of EXAMPLES 11 and 13. As noted above, in EXAMPLE 11, the photoresist was treated during anneal with forming gas only, while in EXAMPLE 13, the photoresist was treated with forming gas and fluorine (in the form of $NF_3$) during anneal.

The improvement in LER in going from left to right is apparent. In particular, the left-most micrograph shows a significant level of LER. By contrast, the middle micrograph (corresponding to EXAMPLE 11) shows some improvement in LER, while the rightmost micrograph (corresponding to EXAMPLE 13) shows the greatest improvement in LER.

The methodologies described herein may be implemented using a variety of tools and line set-ups. In one suitable set-up, the photoresist is applied and baked (to harden it) on a track. The track then unloads the wafer into a stepper which exposes the wafer. The wafer is then loaded back onto the track for development. The track may be equipped with a separate tool for post-development UV bakes, which hardens the resist to enable it to better withstand the subsequent etching performed in the etch platform.

After the device is transferred to the etch platform, an anneal process of the type described herein may be conducted in a chamber attached to the etch platform. The annealed device is then transferred to a trim chamber, where the photoresist is trimmed with a suitable etchant (in some embodiments, trimming precedes the anneal). The trimmed device will then be transported to an etch chamber under vacuum, where subsequent etch processes are used to define the gates and other features of the device.

In some embodiments, it may be possible to implement an anneal process of the type taught herein in situ while the device is on the track. However, it is preferred that the anneal is performed in a separate chamber as noted above. Without wishing to be bound by theory, it is believed that better results are achievable by implementing the anneal process in a separate chamber, possibly because better temperature uniformities are achievable in the gas flow within such a chamber than are achievable on the track. In alternate embodiments, the anneal may be performed after the trim.

Various gases may be utilized in the anneal processes described herein. Preferably, the anneal process is conducted in an atmosphere comprising one or more gases selected from the group consisting of hydrogen, nitrogen and $NF_3$. While the use of $NF_3$ is desirable in embodiments where fluorination of the photoresist is desired, similar results may be attainable through the use of elemental fluorine or through the use of various fluorine containing materials, such as fluorocarbons, which can be decomposed to yield fluorine. Moreover, in some embodiments, varying amounts of helium and argon may also be used.

The temperature of the anneal process described herein may vary. Preferably, this temperature is below the glass flow temperature ($T_G$) of the photoresist so that the photoresist will not run during the anneal process. For many commonly used photoresists, $T_G$ will be around 200° C. Even more preferably, the temperature will be within the range of about 90° C. to about 150° C., and most preferably, the temperature will be within the range of about 120° C. to about 140° C.

The amount of fluorine-containing gas utilized in the methodologies described herein may vary. Generally, the amount of fluorine-containing gas in the gas mixture is within the range of 0 to about 50%. Preferably, the amount of fluorine-containing gas in the gas mixture is within the range of 1 to about 25%, more preferably within the range of about 1% to about 10%, and most preferably within the range of about 2 to about 3%.

The total gas pressure utilized in the methodologies described herein may also vary. Preferably, the total gas pressure is within the range of about 0.1 to about 10 torr, more preferably within the range of about 0.2 to about 5 torr, and most preferably within the range of about 0.5 to about 2 torr.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for processing photoresist, comprising:
   applying a layer of photoresist to a substrate; and
   annealing the layer of photoresist in an atmosphere comprising hydrogen, nitrogen and a fluorine-containing gas.

2. The method of claim 1, wherein the photoresist is annealed below the glass flow temperature ($T_G$) of the photoresist.

3. The method of claim 2, wherein $T_G \leq 200°$ C.

4. The method of claim 1, wherein the photoresist is annealed at a temperature within the range of about 90° C. to about 150° C.

5. The method of claim 1, wherein the photoresist is annealed at a temperature within the range of about 120° C. to about 140° C.

6. The method of claim 1, wherein the fluorine-containing gas is selected from the group consisting of $NF_3$ and fluorocarbons.

7. The method of claim 1, wherein the atmosphere further comprises a material selected from the group consisting of helium and argon.

8. The method of claim 1, wherein the atmosphere comprises a fluorine-containing gas, wherein the atmosphere comprises an amount of hydrogen within the range of about 1% to about 10%, and wherein the atmosphere comprises an amount of nitrogen within the range of about 90% to about 99%.

9. The method of claim 1, wherein the photoresist is trimmed before it is annealed.

10. The method of claim 1, wherein the photoresist is patterned before it is annealed.

11. The method of claim 1, wherein the amount of fluorine-containing gas in the atmosphere is within the range of about 1% to about 10%.

12. The method of claim 1, wherein the amount of fluorine-containing gas in the atmosphere is within the range of about 2% to about 3%.

13. A method for processing photoresist, comprising:
    applying a layer of photoresist to a substrate; and
    annealing the layer of photoresist at a temperature within the range of about 90° C. to about 150° C. in an atmosphere comprising about 1% to about 10% hydrogen and about 90 to about 99% nitrogen, and wherein the atmosphere further comprises a fluorine-containing gas.

14. The method of claim 13, wherein the photoresist is annealed at a temperature within the range of about 120° C. to about 140° C.

15. The method of claim 13, wherein the atmosphere further comprises a material selected from the group consisting of helium and argon.

16. The method of claim 13, wherein the fluorine-containing gas is $NF_3$.

17. The method of claim 13, wherein the fluorine-containing gas is a fluorocarbon.

18. The method of claim 13, wherein the amount of fluorine-containing gas in the atmosphere is within the range of about 1% to about 10%.

19. The method of claim 13, wherein the amount of fluorine-containing gas in the atmosphere is within the range of about 2% to about 3%.

* * * * *